United States Patent
Likhanskii et al.

(10) Patent No.: US 10,804,068 B2
(45) Date of Patent: Oct. 13, 2020

(54) ELECTOSTATIC FILTER AND METHOD FOR CONTROLLING ION BEAM PROPERTIES USING ELECTROSTATIC FILTER

(71) Applicant: APPLIED Materials, Inc., Santa Clara, CA (US)

(72) Inventors: Alexandre Likhanskii, Malden, MA (US); Frank Sinclair, Boston, MA (US); Shengwu Chang, South Hamilton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/197,242

(22) Filed: Nov. 20, 2018

(65) Prior Publication Data

US 2020/0161076 A1 May 21, 2020

(51) Int. Cl.
*H01J 37/05* (2006.01)
*H01J 37/147* (2006.01)
*H01J 37/317* (2006.01)

(52) U.S. Cl.
CPC ............ *H01J 37/05* (2013.01); *H01J 37/147* (2013.01); *H01J 37/3171* (2013.01); *H01J 2237/0475* (2013.01); *H01J 2237/057* (2013.01); *H01J 2237/31705* (2013.01)

(58) Field of Classification Search
CPC ...... H01J 37/05; H01J 37/147; H01J 37/3171; H01J 2237/0475; H01J 2237/057; H01J 2237/31705
USPC .... 250/492.1, 492.2, 492.3, 396 R, 396 ML, 250/397, 398
See application file for complete search history.

(56) References Cited

U.S. PATENT DOCUMENTS

| | | | |
|---|---|---|---|
| 6,326,631 | B1 | 12/2001 | Politiek et al. |
| 6,573,517 | B1 | 6/2003 | Sugitani et al. |
| 7,022,984 | B1 | 4/2006 | Rathmell et al. |
| 7,326,941 | B2 | 2/2008 | Chen et al. |

(Continued)

FOREIGN PATENT DOCUMENTS

| | | |
|---|---|---|
| JP | 2010123547 A | 6/2010 |
| JP | 2015191740 A | 11/2015 |

(Continued)

OTHER PUBLICATIONS

International Search Report and Written Opinion dated Apr. 28, 2020, for the International Patent Application No. PCT/US2019/059075, filed on Oct. 31, 2019, 8 pages.

(Continued)

*Primary Examiner* — Nicole M Ippolito
*Assistant Examiner* — Hanway Chang

(57) ABSTRACT

An apparatus is provided. The apparatus may include a main chamber; an entrance tunnel having a propagation axis extending into the main chamber along a first direction; an exit tunnel, connected to the main chamber and defining an exit direction. The entrance tunnel and the exit tunnel may define a beam bend of at least 30 degrees therebetween. The apparatus may include an electrode assembly, disposed in the main chamber, and defining a beam path between the entrance tunnel and the exit aperture, wherein the electrode assembly comprises a lower electrode, disposed on a first side of the beam path, and a plurality of electrodes, disposed on a second side of the beam path, the plurality of electrodes comprising at least five electrodes.

20 Claims, 14 Drawing Sheets

(56) References Cited

U.S. PATENT DOCUMENTS

| | | |
|---|---|---|
| 7,888,653 B2 | 2/2011 | Kellerman et al. |
| 8,129,695 B2 | 3/2012 | Kellerman et al. |
| 8,389,964 B2 | 3/2013 | Igo et al. |
| 9,293,295 B2 | 3/2016 | Yagita |
| 2004/0013820 A1 | 1/2004 | Cadieu |
| 2009/0189096 A1 | 7/2009 | Chen et al. |
| 2010/0065761 A1 | 3/2010 | Graf et al. |
| 2011/0163229 A1 | 7/2011 | Frosien et al. |
| 2012/0104273 A1 | 5/2012 | Ryding et al. |
| 2012/0168637 A1 | 7/2012 | Radovanov et al. |
| 2013/0119263 A1 | 5/2013 | Snick et al. |
| 2015/0380206 A1 | 12/2015 | White et al. |
| 2016/0189912 A1 | 6/2016 | Eisner et al. |
| 2018/0218894 A1 | 8/2018 | Likhanskii |
| 2019/0259560 A1 | 8/2019 | Chang et al. |

FOREIGN PATENT DOCUMENTS

| | | |
|---|---|---|
| KR | 1020120116451 A | 10/2012 |
| WO | 2007013869 A1 | 2/2007 |
| WO | 2013106220 A1 | 7/2013 |

OTHER PUBLICATIONS

International Search Report and Written Opinion dated Apr. 9, 2020, for the International Patent Application No. PCT/US2019/059067, filed on Oct. 31, 2019, 9 pages.

International Search Report and Written Opinion dated Apr. 9, 2020, for the International Patent Application No. PCT/US2019/059069, filed on Oct. 31, 2019, 10 pages.

International Search Report and Written Opinion dated Apr. 9, 2020, for the International Patent Application No. PCT/US2019/059079, filed on Oct. 31, 2019, 7 pages.

ELECTOSTATIC FILTER AND METHOD FOR CONTROLLING ION BEAM PROPERTIES USING ELECTROSTATIC FILTER

FIELD OF THE DISCLOSURE

The disclosure relates generally to apparatus and techniques for implanting substrates, and more particularly, to improved energy filters for ion beams.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties.

Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In many ion implanters a downstream electrostatic module, may function as an electrostatic lens to control ion beam energy, ion beam shape, and ion beam size. The electrostatic module may accelerate or decelerate an ion beam to a final energy, while altering the direction of the ion beam. By altering the direction of the ion beam, energetic neutrals may be screened out, resulting in a final beam having a well-defined energy.

Known electrostatic modules may employ, for example, multiple pairs of electrodes, such as seven upper and lower electrodes arranged in pairs, where the electrodes bound and guide an ion beam traveling therethrough. The electrodes may be arranged as rods spaced equidistant from an ion beam. The rod/electrode potentials are set to create electric fields in the electrostatic module causing the ion beam to decelerate, deflect and focus the ion beam.

In examples of known configurations of electrostatic modules, five or seven pairs of electrodes may be used to deflect, decelerate, and focus ion beam before exiting at a final beam energy before striking a substrate. The use of a greater number of electrodes, such as seven pairs of electrodes, is useful for processing relatively higher energy, such as above 30 keV, in order to maintain electrostatic stresses at acceptable levels during deceleration of an ion beam. Based on the scaling rules for deceleration lens, the maximum transported beam current through the electrostatic lens is approximately inversely proportional to the square of deceleration length. Thus, electrode configurations having a large number of electrode pairs and a long deceleration length may tend to limit the amount of transported beam current.

With respect to these and other considerations, the present disclosure is provided.

BRIEF SUMMARY

In one embodiment, an apparatus may include a main chamber; an entrance tunnel, having an entrance axis extending into the main chamber along a first direction, and an exit tunnel, connected to the main chamber and defining an exit axis. The entrance tunnel and the exit tunnel may define a beam bend, the beam bend being at least 30 degrees therebetween. The apparatus may include an electrode assembly, disposed in the main chamber, and defining a beam path between the entrance tunnel and the exit tunnel. The electrode assembly may include a lower electrode, disposed on a first side of the beam path, and a plurality of electrodes, disposed on a second side of the beam path, the plurality of electrodes comprising at least five electrodes.

In a further embodiment, a method for controlling an ion beam may include directing the ion beam from an entrance tunnel through a main chamber of an electrostatic filter, and into an exit tunnel, coupled to the main chamber. The method may include assigning, in a first operation, a first plurality of electrode voltages to a plurality of electrodes, respectively, wherein the plurality of electrodes are disposed in the main chamber, and wherein a first number of electrodes of the plurality of electrodes is set at ground potential. The method may also include assigning, in a second operation, a second plurality of electrode voltages to the plurality of electrodes, respectively, wherein a second number of electrodes of the plurality of electrodes is set at ground potential, and wherein the second number is greater than the first number.

In an additional embodiment, a high beam bend electrostatic filter assembly may include a main chamber, an entrance tunnel, the entrance tunnel having a propagation axis extending into the main chamber along a first direction, and a plasma flood gun. The plasma flood gun may include an exit tunnel connected to the main chamber and defining an exit direction, wherein the entrance tunnel and the exit tunnel define a beam bend the beam bend being at least 30 degrees therebetween. The high beam bend electrostatic filter assembly may also include an electrode assembly, disposed in the main chamber, and defining a beam path between the entrance tunnel and the exit tunnel. The electrode assembly may include a lower electrode, disposed on a first side of the beam path, and a plurality of upper electrodes, disposed on a second side of the beam path, where the plurality of upper electrodes include at least five electrodes, and wherein the electrode assembly is disposed on a top side of the entrance tunnel.

Figure 1:
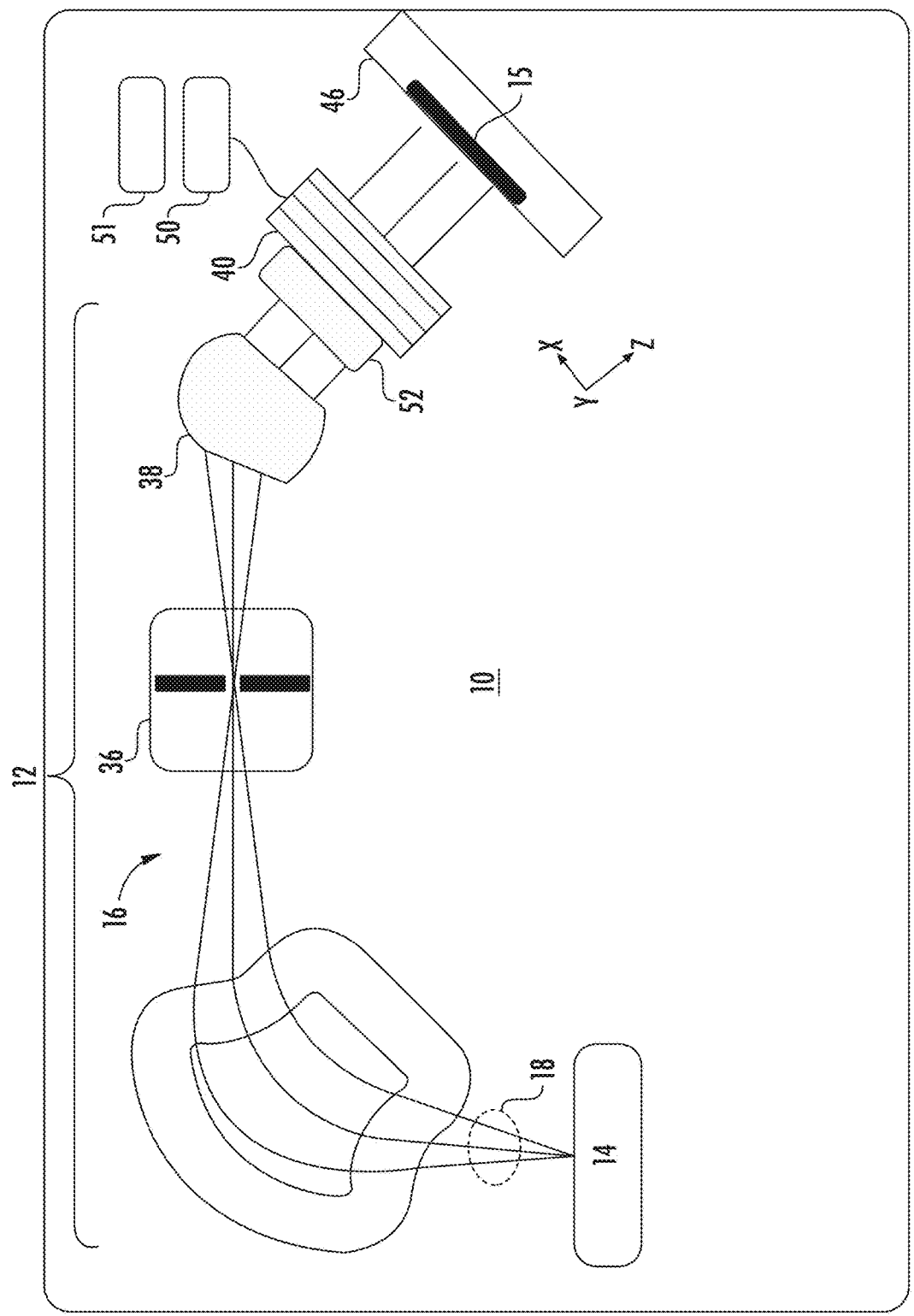
FIG. 1 shows an exemplary embodiment demonstrating an ion implantation system, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved operation and reliability of an electrostatic module acting as an electrostatic filter, for example. In exemplary embodiments, an electrostatic filter is disclosed having a novel architecture, including novel arrangement of an electrode assembly in a main chamber of the electrostatic module.

Provided herein are approaches for improved operation and reliability of an electrostatic module acting as an electrostatic filter, for example. In exemplary embodiments, an electrostatic filter is disclosed having a novel architecture, including novel arrangement of an electrode assembly in a main chamber of the electrostatic module.

Referring now to FIG. 1, an exemplary embodiment demonstrating a system 10 is shown, where the system 10 may be used for ion implantation in accordance with the present disclosure. The system 10 includes, among other components, an ion source 14 for producing an ion beam 18, such as a ribbon beam or a spot beam, and a series of beam-line components. The ion source 14 may comprise a chamber for receiving a flow of gas 24 and generates ions. The ion source 14 may also comprise a power source and an extraction electrode assembly disposed near the chamber. The beamline extending from the ion source 14 to an electrostatic filter 40 may be deemed an upstream beamline 12. In some non-limiting embodiments, the beam-line components 16 of the upstream beamline may include, for example, a mass analyzer 34, a first acceleration or deceleration stage 36, and a collimator 38, disposed upstream of the electrostatic filter 40, which filter may provide deceleration and/or acceleration or the ion beam 18.

In exemplary embodiments, the beam-line components 16 may filter, focus, and manipulate ions or the ion beam 18 to have a species, shape, energy, and/or other qualities. The ion beam 18 passing through the beam-line components 16 may be directed toward a substrate 15 mounted on a platen or clamp within a process chamber 46. The substrate may be moved in one or more dimensions (e.g., translate, rotate, and tilt).

The electrostatic filter 40 is a beam-line component configured to independently control deflection, deceleration, and focus of the ion beam 18. In some embodiments, the electrostatic filter 40 is a vertical electrostatic energy filter (VEEF) or electrostatic filter EF. As will be described in greater detail below, the electrostatic filter 40 and similar electrostatic filters may be arranged as an electrode assembly defining at least one electrode configuration. The electrode configuration may include a plurality of electrodes arranged in series along the beamline to process the ion beam 18 through the electrostatic filter 40. In some embodiments, the electrostatic filter may include a set of upper electrodes disposed above the ion beam 18 and a set of lower electrodes disposed below the ion beam 18. A difference in potentials between the set of upper electrodes and the set of lower electrodes may also be varied along the central ion beam trajectory to deflect the ion beam at various points along the central ray trajectory (CRT). The system 10 may further include an electrode voltage supply, shown as electrode voltage assembly 50, as well as an entrance tunnel 52, coupled to the electrostatic filter 40, where the configuration of the entrance tunnel with respect to the electrostatic filter 40 is described below. As disclosed in various embodiments to follow, the entrance tunnel 52 may form a part of the electrostatic filter 40, where the entrance tunnel and electrodes within the electrostatic filter 40 are arranged in a novel configuration to improve operation of the system 10.

As further shown in FIG. 1, the system 10 may include a controller 51, where the controller 51 may be coupled to the electrode voltage assembly 50 to generate signals to reconfigure potential set for at one of the electrodes of the electrostatic filter 40.

Figure 2A:
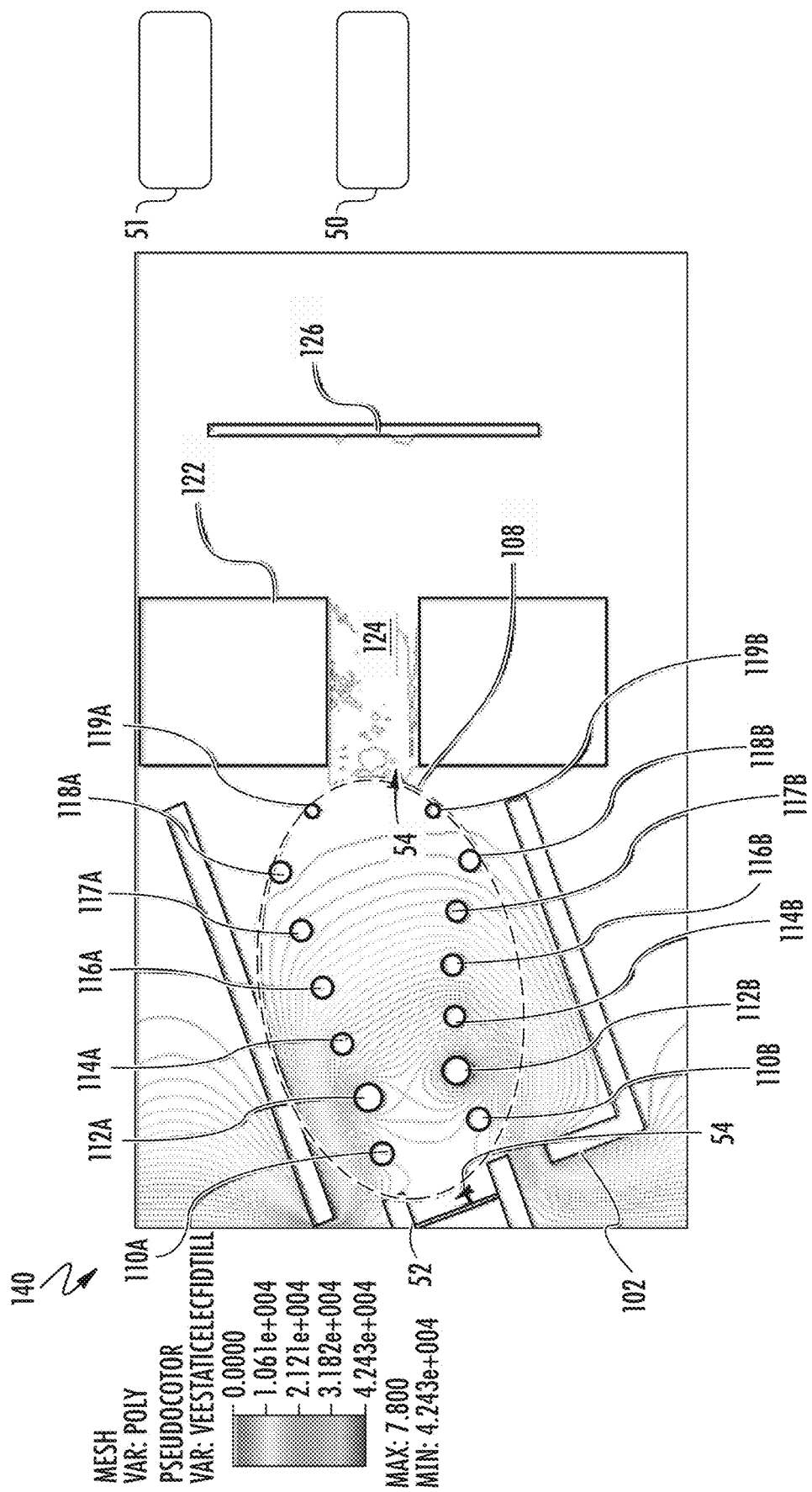
FIGS. 2A-2B show the simulation of potential distributions in an electrostatic filter under two different modes of operation, according to exemplary embodiments of the disclosure.

Referring now to FIG. 2A, the structure of one variant of the electrostatic filter 40 is shown. In FIG. 2A, there is shown a side cross-sectional view the variant of electrostatic filter 40, shown as electrostatic filter 140, together with the entrance tunnel 52, plasma flood gun 122, voltage supply 50, and controller 51. As such, these components may constitute a high beam bend electrostatic filter assembly. For clarity, detailed features of the electrostatic filter 140 may be omitted. As shown, the electrostatic filter 140 includes a main chamber 102, extending above and partially encasing electrostatic filter 40, leaving an entrance aperture 54 and exit aperture 56 to conduct an ion beam therethrough. The electrostatic filter 140 includes electrode assembly 108, including a plurality of pairs of electrodes. These electrodes are designated as electrode 110A, electrode 110B, electrode 112A, electrode 112B, electrode 114A, electrode 114B, electrode 116A, electrode 116B, electrode 117A, and electrode 117B electrode 118A, and electrode 118B, as electrode 119A, and electrode 119B.

As shown in FIG. 2A, the plasma flood gun 122 defines an exit tunnel 124, leading from the main chamber 102. The configuration of electrostatic filter 140 includes 7 pairs of electrodes, where a given pair includes an upper electrode and a lower electrode. In other embodiments, fewer or a larger number of electrodes may be included.

In accordance with embodiments of the disclosure, the electrostatic filter 140 may be operated in a plurality of different modes where the number of grounded electrodes may vary. An advantage of this approach is the ability to adapt beam processing to ion beams having widely different properties, such as widely different final ion energies. In the configuration of FIG. 2A, various electrodes are powered, where the electrodes are set at a negative potential, shown by potential contours. The configuration in FIG. 2A may be deemed a reference mode, appropriate, for example, to deliver a 3 keV P+ ion beam to the substrate 126. In this example, the electrode 110A, electrode 110B, electrode 112A, electrode 112B, electrode 114A, electrode 114B, electrode 116A, electrode 116B, electrode 117A, and electrode 117B are powered. The electrodes 112A and electrode 112B act as suppression electrodes in this configuration, where the negative voltage applied to these electrodes is at a maximum. In successive pairs of electrodes, such as electrode 114A and electrode 114B, electrode 116A and electrode 116B, etc., the absolute value of the negative voltage is reduced, providing for a deceleration of an ion beam toward a final beam energy. The change in voltage may be relatively gradual, as illustrated by the potential contours, extending nearly to the exit aperture 56. As a consequence, this relatively long deceleration length between the electrode pair-electrode 112A, electrode 112B- and electrode pair-electrode 119A, electrode 119B places a relatively low electrostatic stress on the electrodes of electrode assembly 108.

Figure 2B:
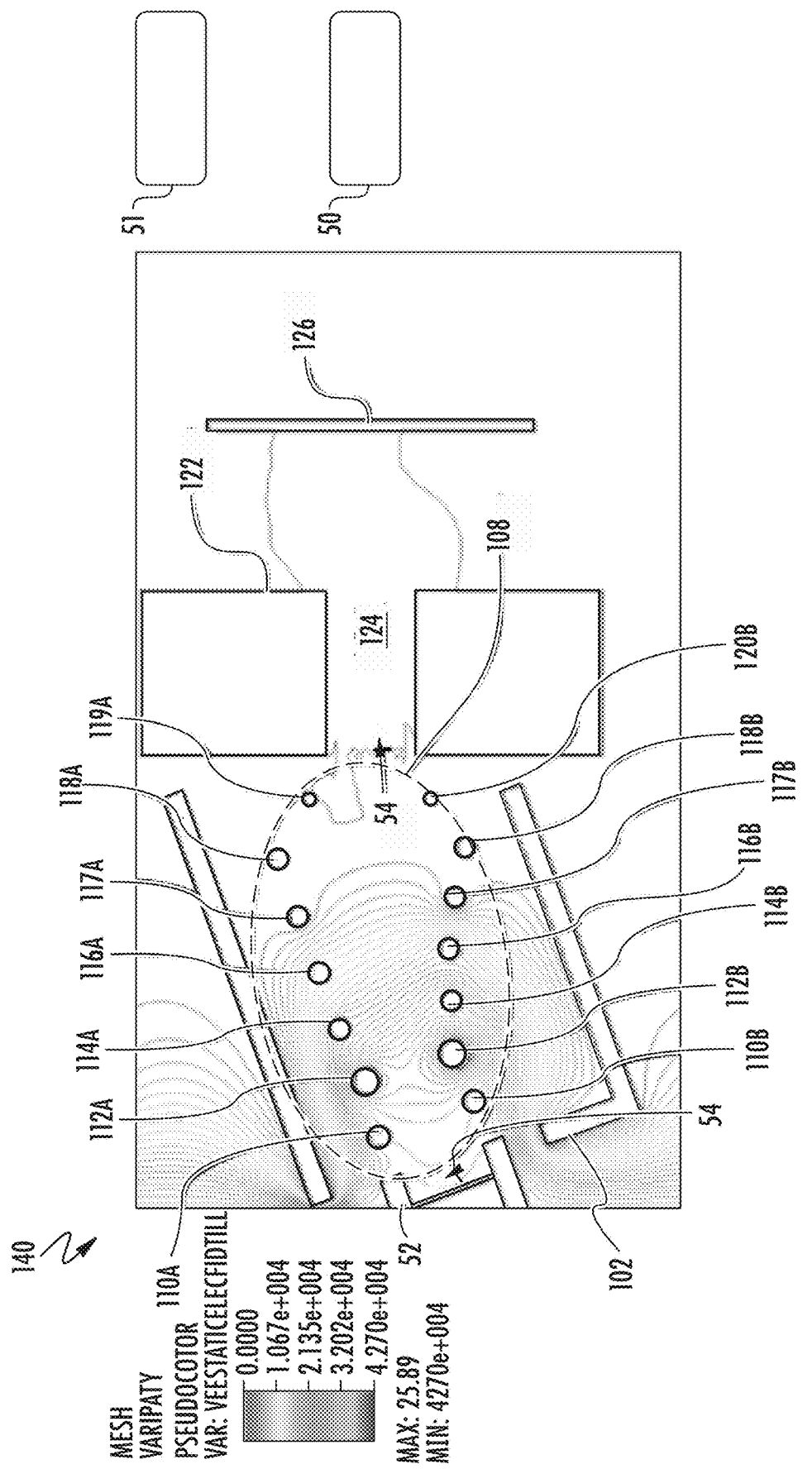

Turning to FIG. 2B, the electrostatic filter 140 is shown in a different operation mode, wherein the voltages assigned to the electrode assembly 108 differ from the configuration of FIG. 2A. This configuration may also be appropriate for the transport of a 3 keV P+ ion beam to the substrate 126 In this example, the electrode 110A, electrode 110B, electrode 112A, electrode 112B, electrode 114A, electrode 114B, electrode 116A, electrode 116B, are powered, while the electrode 117A, electrode 117B, electrode 118A, electrode 118B, electrode 119A, and electrode 119B are set at ground potential. As in FIG. 2A, the electrodes 112A and electrode 112B act as suppression electrodes, where the negative voltage applied to these electrodes is at a maximum. In successive pairs of electrodes, such as electrode 114A and electrode 114B, electrode 116A and electrode 116B, etc., the absolute value of the negative voltage is reduced. Since electrode 117A and electrode 117B are grounded, the deceleration length is less in this configuration. While in principle, this decreased deceleration length may generate increased electrostatic stress on electrodes in the electrode assembly 108, the level of electrostatic stress may be acceptable.

An advantage of the configuration of FIG. 2B is the relatively larger beam current transported through the electrostatic filter 140. Under one set of conditions where voltages applied to the electrodes 110A-116B remain nearly constant between FIG. 2A and FIG. 2B, the grounding of the six electrodes 117A-119B in FIG. 2B may generate approximately 60% greater beam current at the substrate 126 as compared to the configuration of FIG. 2A.

Figure 3A:
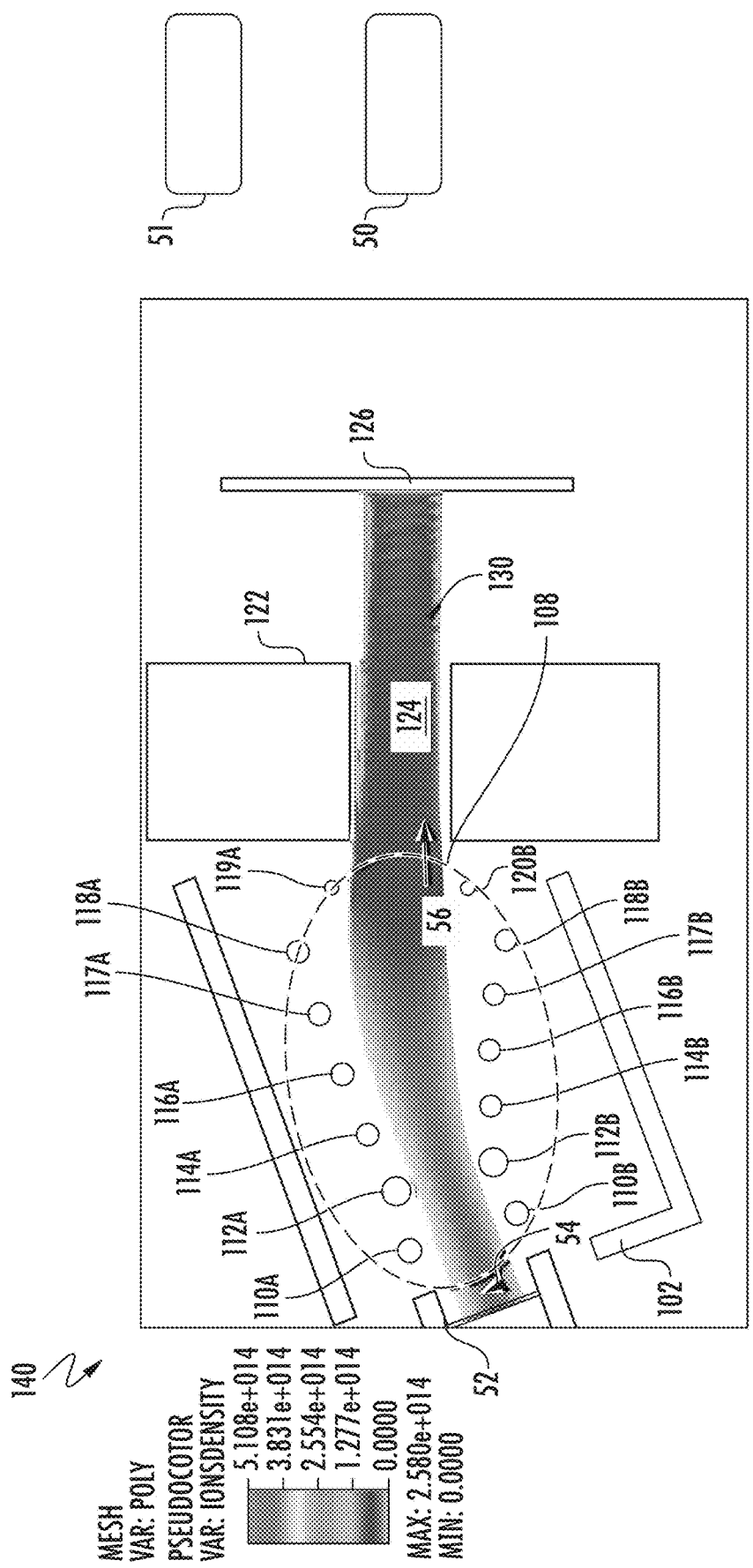
FIG. 3A and FIG. 3B illustrate simulations of beam profiles for a phosphorous ion beam under the two different modes of operation, corresponding to FIG. 2A and FIG. 2B, respectively.
Figure 3B:
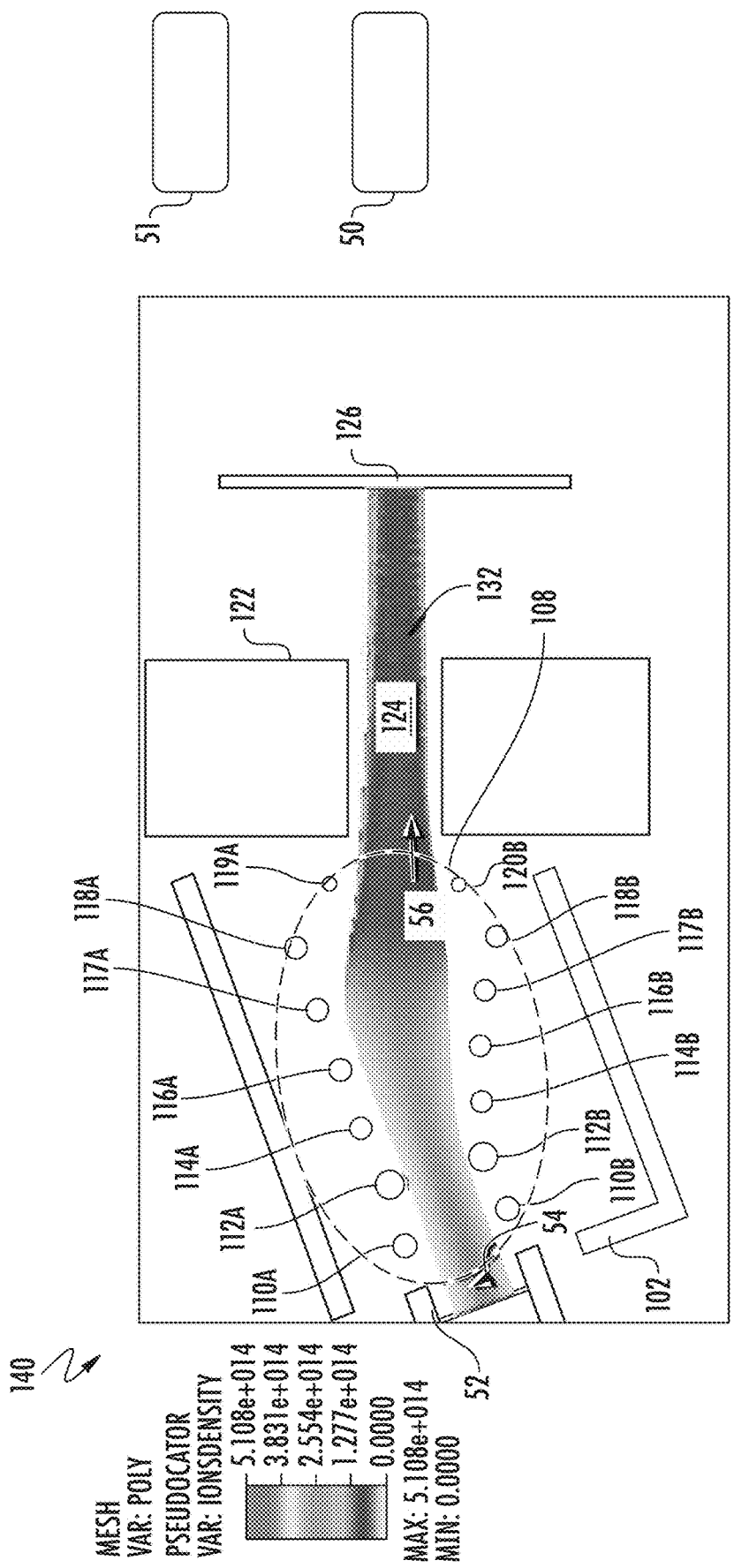

FIG. 3A and FIG. 3B present illustrations of 3 keV phosphorous ion beams processed under the electrostatic configurations of FIG. 2A and FIG. 2B, respectively. As noted, the phosphorous ion beam of FIG. 3B transports 60% more current to the substrate 126 than the phosphorous ion beam of FIG. 3A, at the same ion energy.

In view of the above results, the electrostatic filter 140 may be advantageously operated in the following manner. For relatively higher final ion beam energy, such as above 30 keV, the electrostatic configuration may be set where a minimum number of electrodes are grounded, such as a last pair of electrodes or no electrodes. For relatively lower final ion beam energy, the electrostatic configuration may be set where at least two electrodes are grounded, such as a final four electrodes, a final six electrodes, and so forth.

Figure 4A:
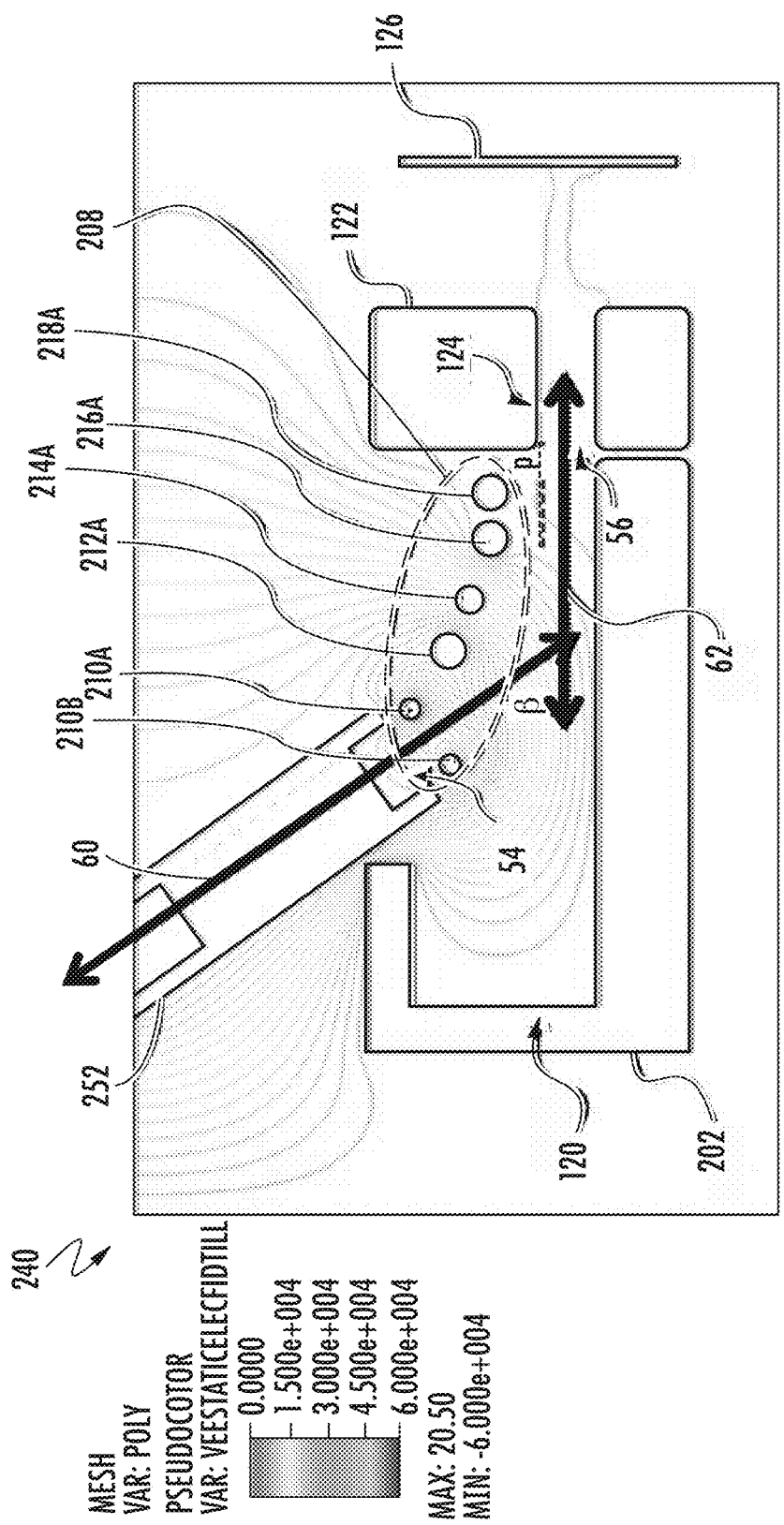
FIG. 4A and FIG. 4B show the simulation of potential distributions in another electrostatic filter under two different modes of operation, according to further embodiments of the disclosure.
Figure 4B:
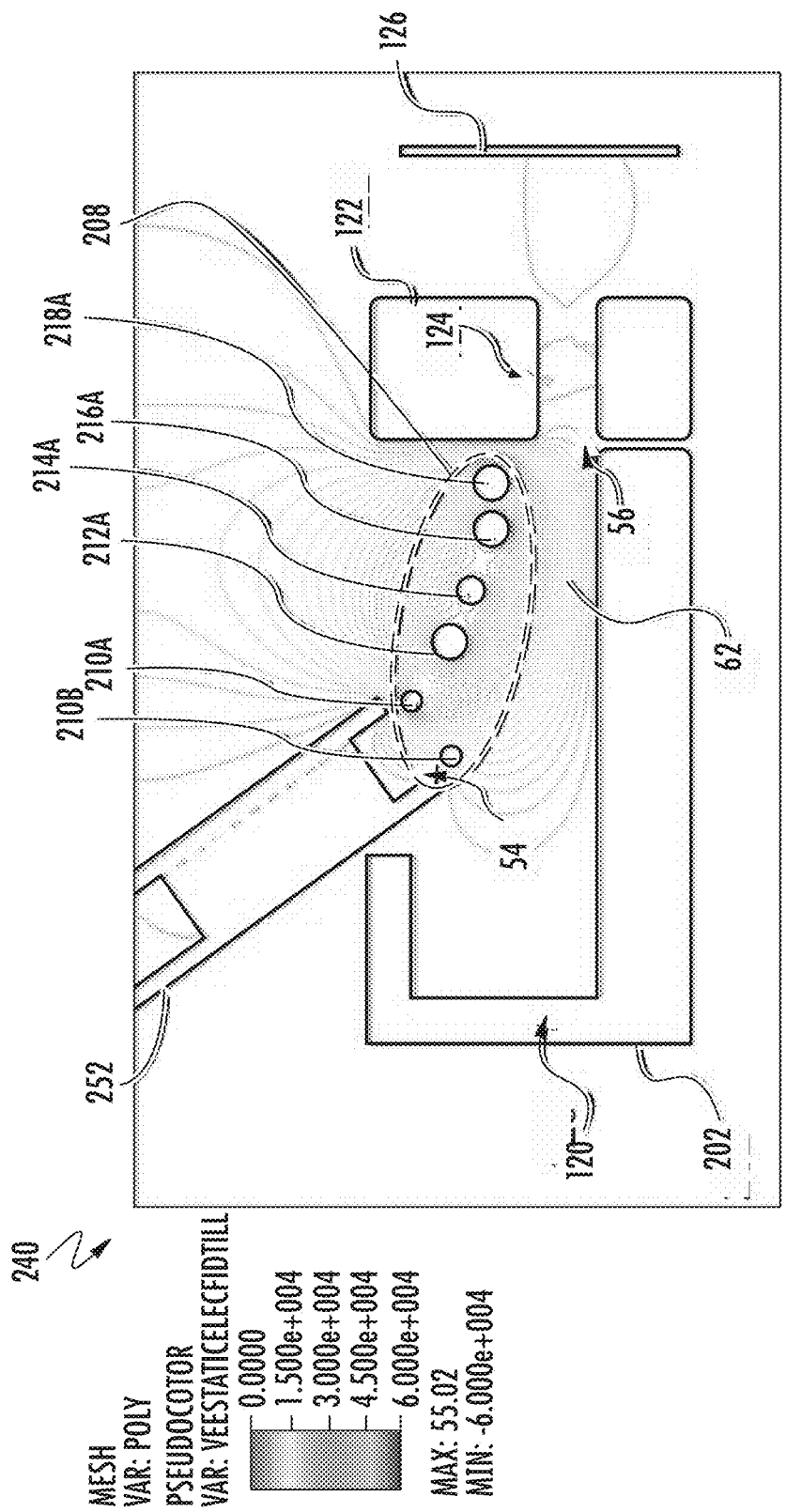

Turning to FIG. 4A and FIG. 4B there is shown the simulation of potential distributions in another electrostatic filter under two different modes of operation, according to further embodiments of the disclosure. In these embodiments, an electrostatic filter 240 includes an entrance tunnel 252, disposed on a top side of a main chamber 202, where the entrance tunnel 252 is arranged to direct an ion beam into the main chamber 202 from the top. As further shown in FIG. 4A, the entrance tunnel 52 may be characterized by an entrance axis 60, extending into the main chamber 202 along a first direction. Also shown inn FIG. 4A is an exit tunnel 124, where the exit tunnel 124 defines an exit axis 62. In the embodiment of FIG. 4A, the entrance axis 60 and the exit axis 62 define a beam bend of at least 30 degrees therebetween. The beam bend is shown in FIG. 4A as the angle β. While in some embodiments, the beam bend may be as small as 30 degrees, in other embodiments, the beam bend may be between 40 degrees and 90 degrees. The apparatus of FIG. 4A may therefore be termed a high beam bend electrostatic filter, and may be appropriate for use where contamination is to be minimized and maintenance is to be improved, as explained further below.

As further shown in FIG. 4A, a plurality of electrodes are arranged in an electrode assembly 208, characterized by an asymmetric configuration. The asymmetric configuration is embodied in this case where just one electrode, electrode 210B, is disposed on a lower side of a beam path (for representative beam paths, see ion beam 260 and ion beam 262 of FIG. 5A and FIG. 5B, respectively). In the configuration of FIG. 4A, five electrodes are disposed on an upper side of the beam path, shown as electrode 210A, electrode 212A, electrode 214A, electrode 216A, and electrode 218A. In the configuration shown, all the electrodes of electrode assembly 208 are disposed above the exit tunnel 124, meaning above a horizontal plane P, representing a top surface of the exit tunnel 124.

As with electrostatic filter 140, the electrostatic filter 240 may be operated in different operation modes, described below. In the configuration of FIG. 4A, electrode 210A and electrode 210B act as suppression electrodes, where the most negative potential of all electrodes is set for electrode 210A and electrode 210B. In the configuration of FIG. 4A, the electrode 216A and electrode 218A are set at ground potential, while the chamber walls 120 are also set at ground potential. In this configuration, a relatively shorter deceleration length is therefore established, appropriate for processing low energy and high current ion beams.

Turning to FIG. 4B there is shown an electrostatic configuration for another mode of operation, where all the electrodes of electrode assembly 208 are powered. In this example, the electrode 216A and electrode 218A are also powered at relatively higher voltage, to allow sufficient path length for bending an ion beam, such as a high energy ion beam, where ion energy may be 30 keV or more. At the same time, the chamber walls 120 may remain grounded. The tailoring of the electrostatic configuration according to ion beam energy allows the electrostatic filter 240 to process ion beams of widely varying energy, such as 1 keV to 75 keV, while still obtaining acceptable levels of beam current delivered to a substrate 126, even at the lower range of energy.

Figure 5A:
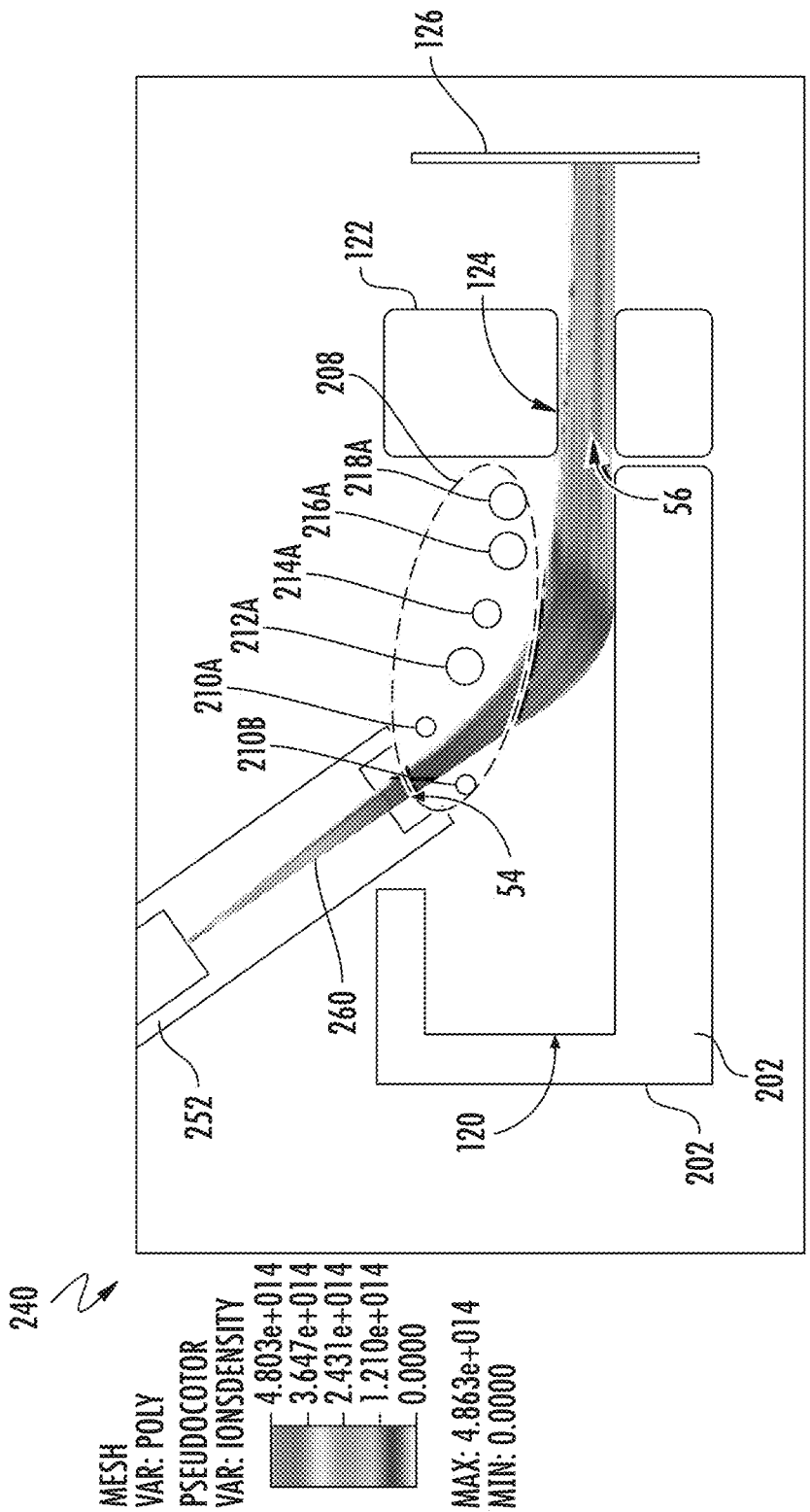
FIG. 5A and FIG. 5B illustrate simulations of beam profiles for a phosphorous ion beam under the two different modes of operation, corresponding to FIG. 4A and FIG. 4B, respectively.
Figure 5B:
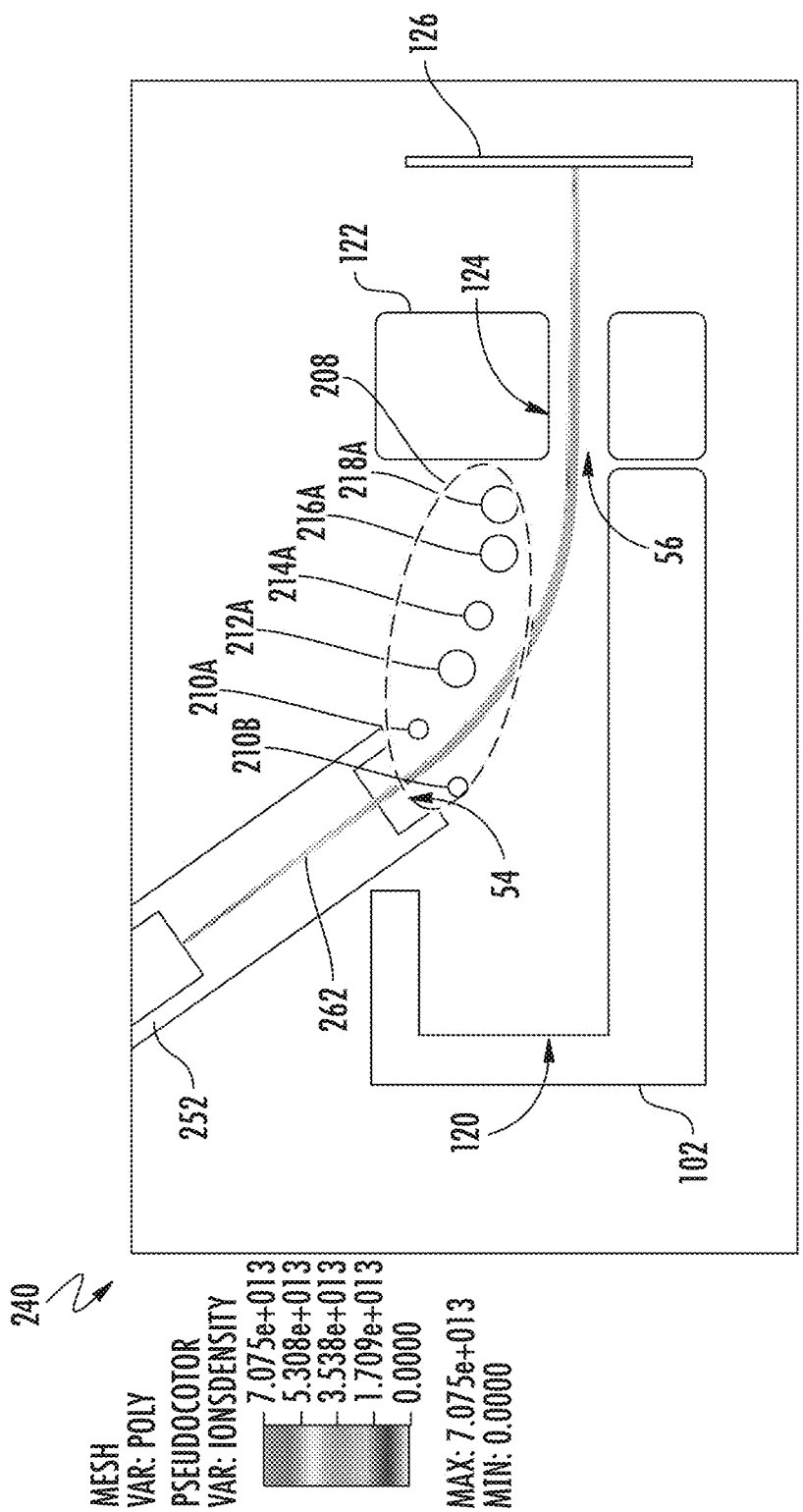

FIG. 5A and FIG. 5B present illustrations of a 3 keV phosphorous ion beam and a 60 keV phosphorous ion beam, processed under the electrostatic configurations of FIG. 4A and FIG. 4B, respectively. Turning to FIG. 5A, there is shown a simulation in a cross-sectional view of a high current P+ 3 kV beam, delivering 56 mA current at the substrate 126. As illustrated, the ion beam 260 becomes taller (along a direction perpendicular to the instantaneous direction of propagation) after emerging from the entrance tunnel 252, occupying nearly the full height of the exit tunnel 124. Since the maximum beam current transported through a deceleration lens such as the electrostatic filter 240 is approximately inversely proportion to the square of deceleration length, the reduced deceleration length is able to generate a much higher beam current, in comparison to a configuration having a longer deceleration length.

FIG. 5B shows an ion beam 262, generated at 60 kV, where the electrostatic configuration of FIG. 4B produces a relatively shorter ion beam, while bending the ion beam through the appropriate angle.

One salient feature of the electrode configuration of the electrostatic filter 240 is the placement of the entrance tunnel 52 exit tunnel 124, as well as the placement of electrodes with respect to the exit tunnel 124. In particular, the entrance tunnel 52 is disposed along a first side of the main chamber 202, and the exit tunnel 124 is disposed along a second side of the main chamber 202, adjacent to the first side of the main chamber 202. Additionally, because the electrodes of the electrode assembly 208 are disposed above the exit tunnel 124, the electrodes may be protected from species emitted from the substrate 126 and traveling back through the exit tunnel 124, as explained below.

Figure 6A:
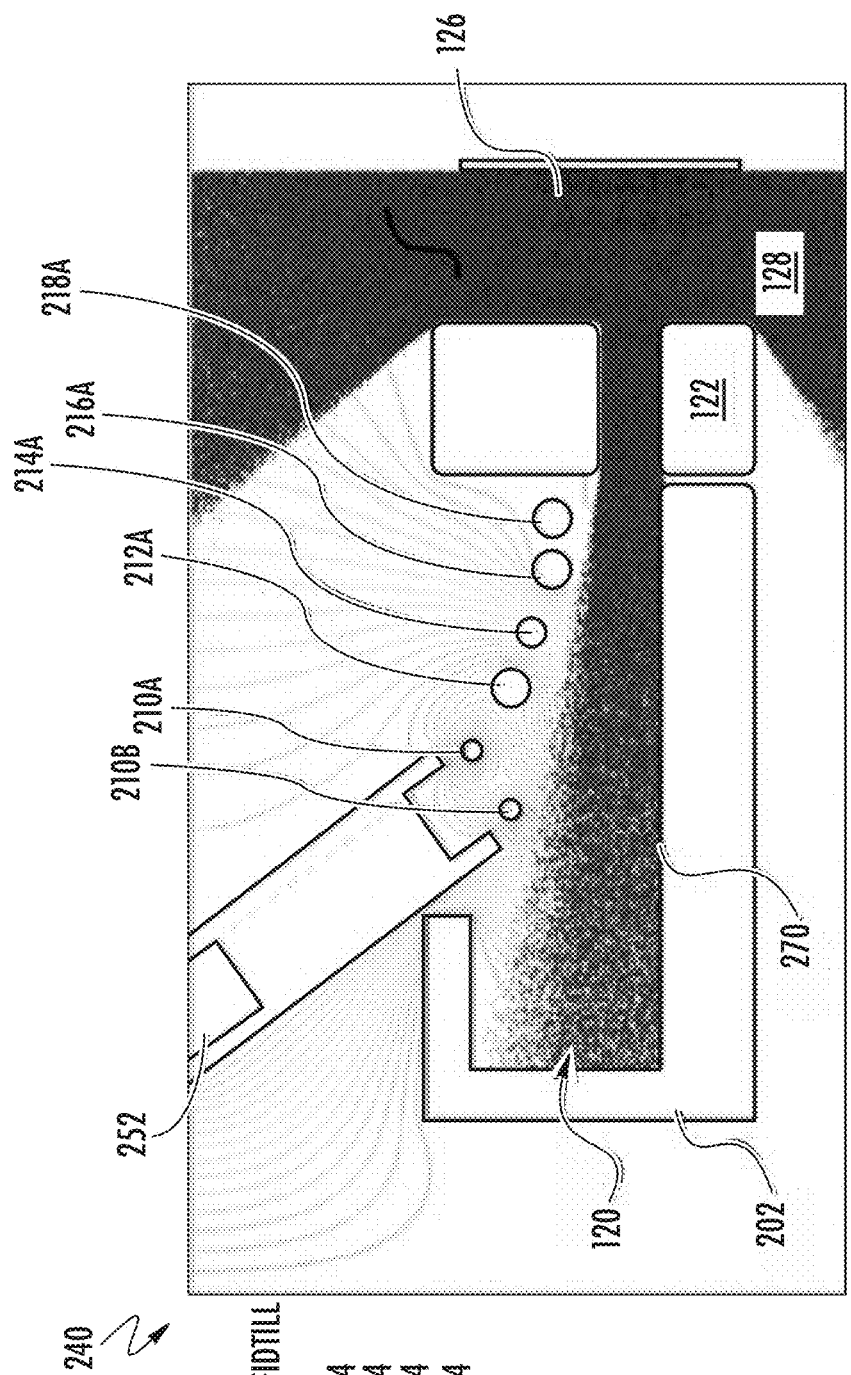
FIG. 6A and FIG. 6B illustrate simulations of resputtered particle distributions for a phosphorous ion beam under the two different modes of operation, corresponding to FIG. 4A and FIG. 4B, respectively.

FIG. 6A illustrates a simulation of the trajectories of particles 270, resputtered from the substrate 126 by a 3 kV P+ ion beam, within the electrostatic filter 240, according to embodiments of the present disclosure. The simulation of FIG. 6A shows the distribution of sputtered material ejected from the substrate 126 under the electrostatic configuration shown in FIG. 4A. The sputtered material represents material initially disposed at the substrate 126, where an incident phosphorous ion beam used to implant 3 kV ions into the substrate 126, respecters a certain amount of material located on or near the surface of the substrate 126. The simulation of FIG. 6A illustrates resputtered material may be ubiquitous in the downstream region 128, located between the plasma flood gun 122 and the substrate 124. In addition, the exit tunnel 124, defined by the plasma flood gun 122, is replete with resputtered particles, indicating t the particles travel back from the substrate 126 toward the main chamber 102 of the electrostatic filter 240.

As further shown in FIG. 6A, the simulation of resputterred particles forms a dense plume within the main chamber 102, with a somewhat denser portion in line with the exit tunnel 124. A less dense portion of the plume expands upwardly into the main chamber 102. The plume of sputtered particles may then land at various locations of the chamber walls 120 of the main chamber 102. In this simulation, few, if any, resputtered particles land on electrodes of the electrode assembly 108. Thus, the configuration of FIG. 6A is unlikely to accumulate any resputtered material on electrodes of the electrode assembly 108, at least by direct resputtering from the substrate 126.

Figure 6B:
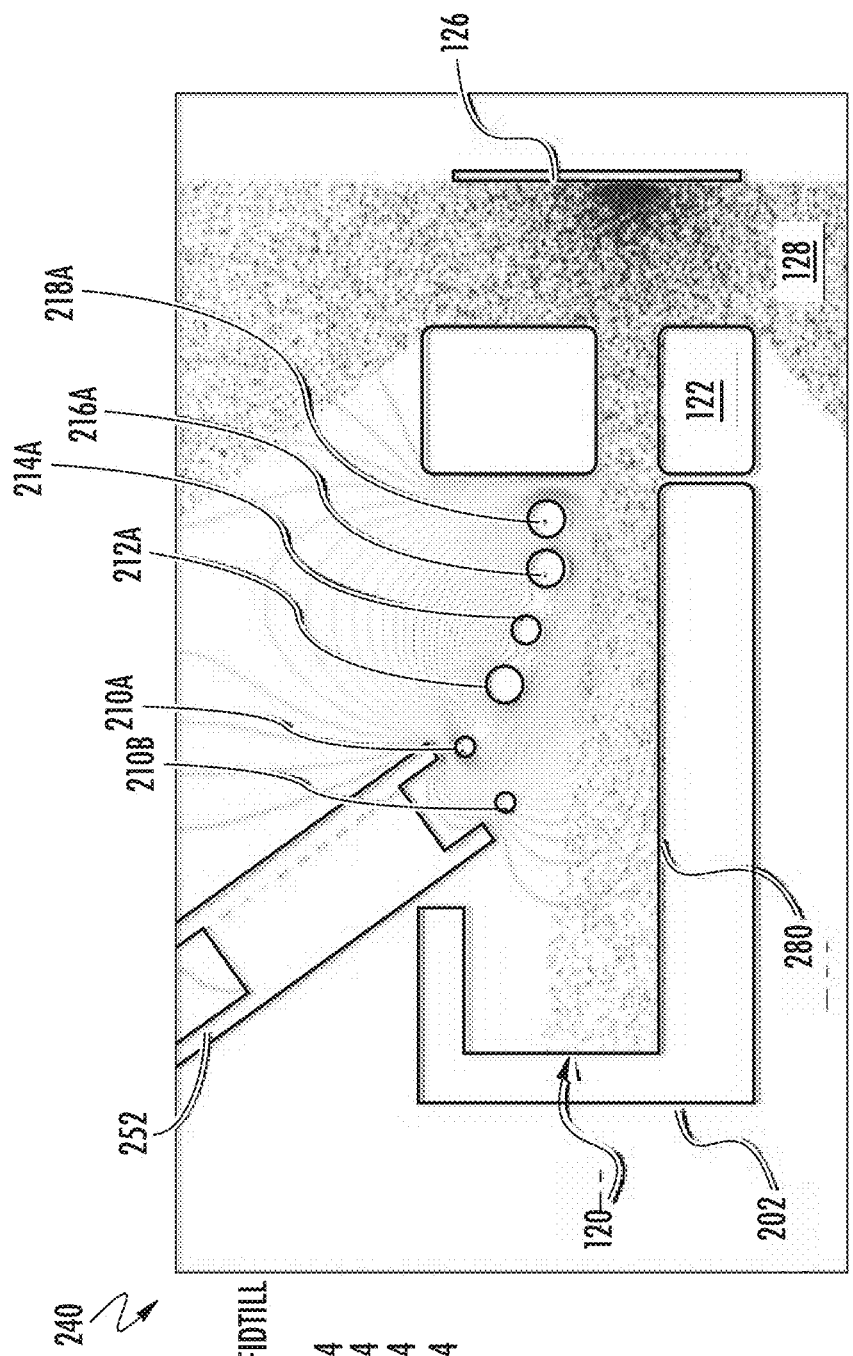

FIG. 6B illustrates a simulation of the trajectories of particles 280, resputtered from the substrate 126 by a 60 kV P+ ion beam, within the electrostatic filter 240, according to embodiments of the present disclosure. The simulation of FIG. 6B shows the distribution of sputtered material ejected from the substrate 126 under the electrostatic configuration shown in FIG. 4B. The sputtered material represents material initially disposed at the substrate 126, where an incident phosphorous ion beam used to implant 60 kV ions into the substrate 126, resputters a certain amount of material located on or near the surface of the substrate 126. The simulation of FIG. 6B illustrates resputtered material may be ubiquitous in the downstream region 128, located between the plasma flood gun 122 and the substrate 124. In addition, the exit tunnel 124, defined by the plasma flood gun 122, is replete with resputtered particles, indicating the particles travel back from the substrate 126 toward the main chamber 102 of the electrostatic filter 240.

As further shown in FIG. 6B, the simulation of resputterred particles forms a plume expanding into the lower portion of the main chamber 102. The plume of sputtered particles may then land at various locations of the chamber walls 120 of the main chamber 102. In this simulation, few, in any, resputtered particles land on electrodes of the electrode assembly 108. Thus, the configuration of FIG. 6B is unlikely to accumulate any resputtered material on electrodes of the electrode assembly 108, at least by direct resputtering from the substrate 126.

Figure 7A:
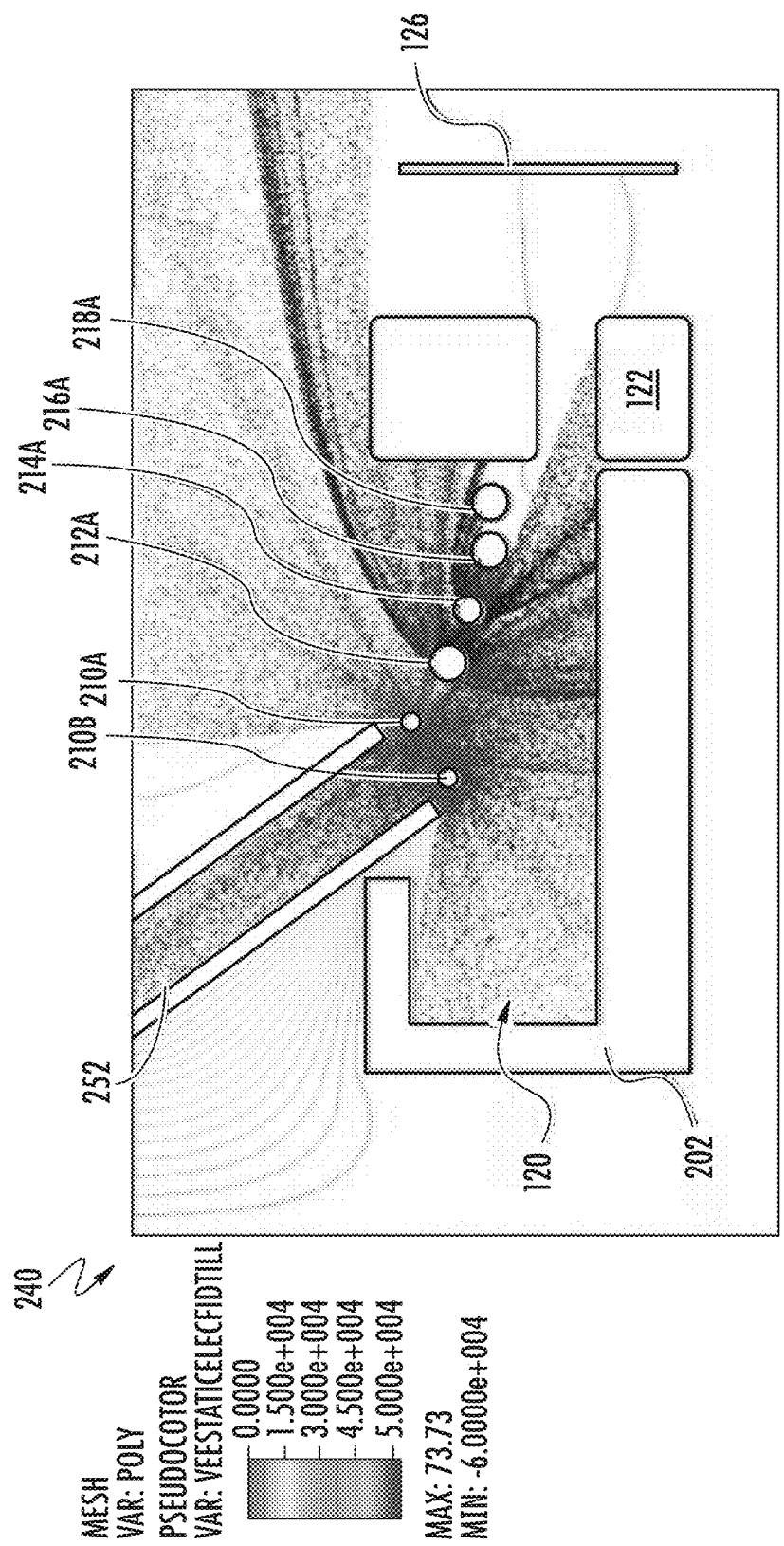
FIG. 7A and FIG. 7B illustrate simulations of negative particle trajectory distributions for a phosphorous ion beam under the two different modes of operation, corresponding to FIG. 4A and FIG. 4B, respectively.

Turning now to FIG. 7A, there is shown a further simulation of operation of the electrostatic filter 240 under the electrostatic conditions of FIG. 4A. Specifically, FIG. 7A depicts trajectories of negatively charged particles leaving from the electrodes of the electrode assembly 108, when voltages are applied to the electrodes as in FIG. 4A. The trajectories of negatively charged particles tend to lead away from a given electrode, forming a complex pattern, dependent upon the individual voltages applied to the different electrodes. Notably, none of negative charged particle trajectories lead to the substrate 126, due to the shielding provided by the geometry of the exit tunnel 124 with respect to the positions of the electrodes of electrode assembly 108.

Figure 7B:
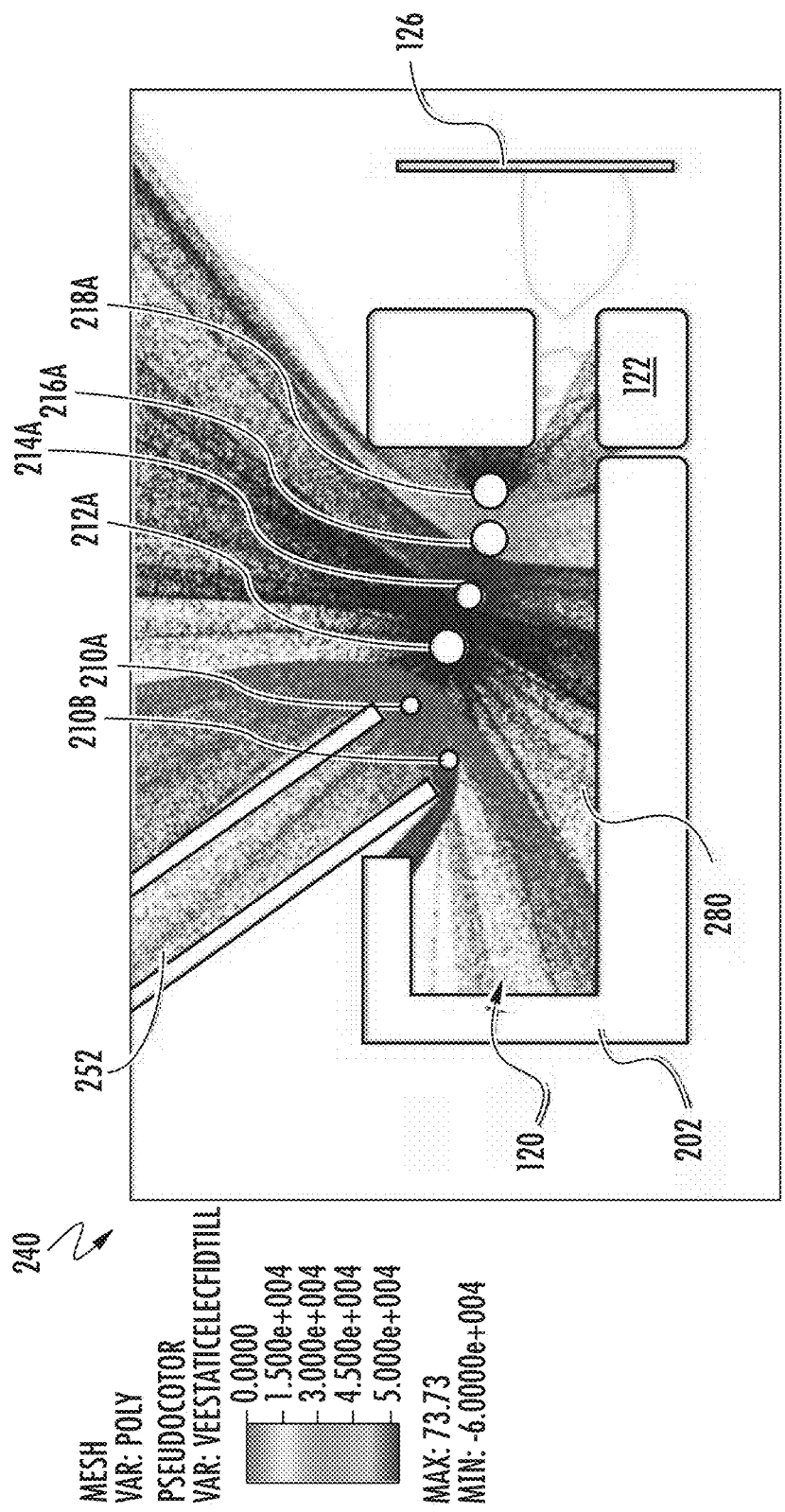

Turning now to FIG. 7B, there is shown a further simulation of operation of the electrostatic filter 240 under the electrostatic conditions of FIG. 4B. Specifically, FIG. 7B depicts trajectories of negatively charged particles leaving from the electrodes of the electrode assembly 108, when voltages are applied as in FIG. 4B. The trajectories of negatively charged particles tend to lead away from a given electrode, forming a complex pattern, dependent upon the individual voltages applied to the different electrodes. Notably, none of negative charged particle trajectories lead to the substrate 126, due to the shielding provided by the geometry of the exit tunnel 124 with respect to the positions of the electrodes of electrode assembly 108.

In accordance with various embodiments, the electrodes of electrode assembly 108 may be elongated along the X-axis of the Cartesian coordinate system shown. As such, the electrodes may be useful for controlling a ribbon beam having a cross-section, also elongated along the X-axis, where the ribbon beam may be tens of centimeters wide along the X-axis and may have a height on the order of several centimeters. The embodiments are not limited in this context.

The specific configuration of electrodes of FIG. 4A-7B, where one electrode is arranged on one side of the beam path and five electrodes are arranged on an opposite side of the beam path, may be especially appropriate for processing ion beams over a wide range of final ion beam energy and beam current. For example, these configurations may be suitable for operation from 1 keV to 75 keV, as noted. For operation at lower voltages, such as less than 10 kV, where relatively high perveance conditions may exist, one or more electrodes may be grounded, decreasing the deceleration length and facilitating transport of higher beam current to the substrate. For operation at relatively higher energy, such as above 30 kV, most or all electrodes may be powered to properly steer the ion beam. Moreover, while the above embodiments illustrate configurations having five electrodes on one side of a beam path, in other configurations, four electrodes, six electrodes, or more may be arranged on one side of the beam path. Additionally, while the above embodiments show just one electrode on the opposite side of the beam path, in other embodiments, more than one electrode may be arranged on the opposite side of the beam path.

In addition, configurations are possible where the electrodes are arranged to define a steeper beam bend, such as 60 degrees, 70 degrees, 80 degrees, or 90 degrees, or a lower beam bend, such as 30 degrees. In these other configurations, the arrangement of the shape of the main chamber, the position of electrodes and the location of the exit tunnel may be such to prevent or substantially reduce resputtered particles from the substrate from striking the electrodes, and to prevent or reduce negatively charged particles from exiting electrodes and striking the substrate.

Figure 8:
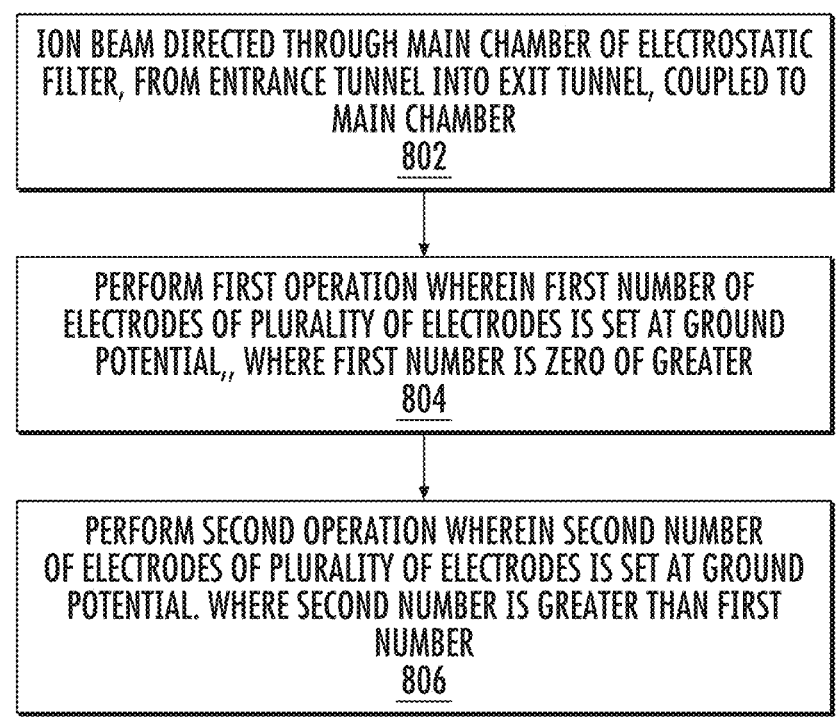
FIG. 8 depicts an exemplary process flow according to some embodiments of the disclosure.

Turning now to FIG. 8, there is shown an exemplary process flow 800, in accordance with embodiments of the disclosure.

At block 802 an ion beam is directed through a main chamber of an electrostatic filter, from an entrance tunnel and into an exit tunnel, coupled to the main chamber. The electrostatic filter may be arranged to deflect, focus, decelerate, and/or accelerated the ion beam according to various embodiments.

At block 804, in a first operation a first plurality of electrode voltages is assigned to a respective plurality of electrodes, disposed in the main chamber. According to various embodiments, in the first operation a first number of electrodes of the plurality of electrodes is set at ground potential, where the first number may be zero or greater. As such, the ion beam, when passing through the main chamber, may be processed through a relatively longer deceleration length.

At block 806, in a second operation a second plurality of electrode voltages is assigned to the respective plurality of electrodes, disposed in the main chamber. According to various embodiments, in the second operation a second number of electrodes of the plurality of electrodes is set at ground potential, where the second number is greater than the first number. As such, the ion beam, when passing through the main chamber, may be processed through a relatively shorter deceleration length. The second operation may be performed when a relatively lower energy ion beam, and relatively higher current ion beam is to be processed through the electrostatic filter, such as for energies below 10 keV.

In view of the foregoing, at least the following advantages are achieved by the embodiments disclosed herein. The present embodiments provide a first advantage in that operation of an ion implanter over a wide range of ion beam energy and ion beam current using a single type of electrostatic filter. By adjusting the grounded electrode configuration in an electrostatic filter operation may be tailored according to the ion energy. Another advantage afforded by embodiments of the disclosure is the reduction of direct contamination of a substrate from an electrostatic filter by eliminating the ability for negatively charged particles generated the filter electrodes from striking the substrate. In addition, another advantage provided by the present embodiments is the elimination of indirect substrate contamination resulting from accumulation of resputtered material from the substrate on electrodes of the electrostatic filter, resulting in an additional contamination source do to subsequent sputtering or flaking from the electrodes.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

The invention claimed is:

1. An apparatus, comprising:
   a main chamber;
   an entrance tunnel, the entrance tunnel having an entrance axis extending into the main chamber along a first direction;
   an exit tunnel, connected to the main chamber and defining an exit axis, wherein the entrance tunnel and the exit tunnel define a beam bend, the beam bend being at least 30 degrees therebetween; and
   an electrode assembly, disposed in the main chamber, and defining a beam path between the entrance tunnel and the exit tunnel,
   wherein the electrode assembly comprises a lower electrode, disposed on a first side of the beam path, and a plurality of electrodes, disposed on a second side of the beam path, the plurality of electrodes comprising at least five electrodes.

2. The apparatus of claim 1, further comprising a voltage assembly, connected to the electrode assembly, the voltage assembly arranged to change a set of potentials applied to the electrode assembly, from a first configuration, where no electrodes of the plurality of electrodes are set at ground potential, to a second configuration where at least one electrode of the set of electrodes is set at ground potential.

3. The apparatus of claim 2, wherein in the second configuration at least two electrodes of the electrode assembly are set at ground potential.

4. The apparatus of claim 2, wherein, in the first configuration, the electrode assembly defines a first deceleration length, wherein, in the second configuration where the electrode assembly defines a second length, the second length being less than the first length.

5. The apparatus of claim 1, wherein just one electrode is disposed on the first side of the beam path.

6. The apparatus of claim 1, wherein the entrance tunnel is disposed along a first side of the main chamber, and wherein the exit tunnel is disposed along a second side of the main chamber, adjacent to the first side of the main chamber.

7. The apparatus of claim 1, further comprising a plasma flood gun, wherein the plasma flood gun includes the exit tunnel, wherein the plurality of electrodes are not visible from outside the plasma flood gun.

8. The apparatus of claim 7, wherein the exit tunnel is set at ground potential.

9. The apparatus of claim 1, wherein the beam bend is between 40 degrees and 90 degrees.

10. A method for controlling an ion beam, comprising:
directing the ion beam from an entrance tunnel through a main chamber of an electrostatic filter, and into an exit tunnel, coupled to the main chamber;
assigning, in a first operation, a first plurality of electrode voltages to a plurality of electrodes, respectively, wherein the plurality of electrodes are disposed in the main chamber, and wherein a first number of electrodes of the plurality of electrodes is set at ground potential; and
assigning, in a second operation, a second plurality of electrode voltages to the plurality of electrodes, respectively, wherein a second number of electrodes of the plurality of electrodes is set at ground potential, and wherein the second number is greater than the first number.

11. The method of claim 10, wherein in the second operation at least two electrodes of the plurality of electrodes are set at ground potential.

12. The method of claim 11, wherein, in the first operation, the electrode assembly defines a first deceleration length, wherein, in the second operation the electrode assembly defines a second length, the second length being less than the first length.

13. The method of claim 10, wherein in the first operation, the ion beam exits the main chamber at a first final energy, and wherein in the second operation the ion beam exits the main chamber at a second final energy, less than the first final energy.

14. The method of claim 10, wherein the plurality of electrodes are disposed in an asymmetric arrangement.

15. The method of claim 14, wherein just one electrode is disposed on a first side of a beam path, the beam path extending as an arc between the entrance tunnel and an exit tunnel of the main chamber,
and wherein at least five electrodes are disposed on a second side of the beam path.

16. The method of claim 10, wherein the plurality of electrodes comprises a plurality of electrode pairs, wherein in a given electrode pair, a lower electrode is disposed on a first side of a beam path, the beam path extending as an arc between the entrance tunnel and an exit aperture of the main chamber,
and wherein a second electrode is disposed on a second side of the beam path.

17. The method of claim 16, wherein in the second operation, at least one electrode pair of the plurality of electrodes is set at ground potential.

18. A high beam bend electrostatic filter assembly, comprising:
a main chamber;
an entrance tunnel, the entrance tunnel having a propagation axis extending into the main chamber along a first direction;
a plasma flood gun, the plasma flood gun having an exit tunnel connected to the main chamber and defining an exit direction, wherein the entrance tunnel and the exit tunnel define a beam bend the beam bend being at least 30 degrees therebetween; and
an electrode assembly, disposed in the main chamber, and defining a beam path between the entrance tunnel and the exit tunnel,
wherein the electrode assembly comprises a lower electrode, disposed on a first side of the beam path, and a plurality of upper electrodes, disposed on a second side of the beam path, the plurality of upper electrodes comprising at least five electrodes, and
wherein the electrode assembly is disposed on a top side of the entrance tunnel.

19. The high beam bend electrostatic filter assembly of claim 18, wherein the exit tunnel is set at ground potential.

20. The high beam bend electrostatic filter assembly of claim 18, wherein the beam bend is between 40 degrees and 90 degrees.

* * * * *